March 11, 1969 P. D. DAVIDSE ET AL 3,432,417

LOW POWER DENSITY SPUTTERING ON SEMICONDUCTORS

Filed May 31, 1966

INVENTORS
PIETER D. DAVIDSE
LEON I. MAISSEL

BY George O. Saile
ATTORNEY 3,432,417

LOW POWER DENSITY SPUTTERING ON SEMICONDUCTORS

Pieter D. Davidse and Leon I. Maissel, Poughkeepsie, N.Y., assignors to International Business Machines Corporation, Armonk, N.Y., a corporation of New York Filed May 31, 1966, Ser. No. 554,131
U.S. Cl. 204—192 19 Claims
Int. Cl. C23c *15/00*

The present invention relates to an improved method for sputtering films onto a semiconductor surface, and more particularly to a method for sputtering an insulator film onto a bare semiconductor surface without materially injuring the surface.

Insulator films have generally been used in the semiconductor art for masking semiconductor surfaces during diffusion and other additive processes and techniques, and for passivation of the semiconductor products such as transistors, diodes, passive devices, and integrated circuits. The usual insulator film has been thermally grown silicon dioxide for both masking and passivation of silicon devices. Various glasses have also been used for passivation. The glasses, however, have been applied through sedimenting procedures followed by fusion of the glass particles into the uniform layer using heat such as taught in the W. A. Pliskin and E. E. Conrad U.S. Patent 3,212,921.

The use of thermally grown silicon dioxide films on semiconductor surfaces has been quite successful. However, there are limitations to the process. The thermally grown silicon dioxide process is limited to silicon semiconductor material and the temperatures necessary for thermal growth are quite high. Other semiconductor material such as germanium and the III–V compounds are becoming more important in the production of specialized semiconductor devices, and a suitable method for applying insulator films for these materials must be found. The high temperatures which are required for the thermal growth of the silicon dioxide on silicon have the effect of causing the internal diffusion of dopants within the semiconductor body thereby adversely affecting the PN junctions which have already been formed in the body. Further, other very useful insulator films, such as silicon nitride, cannot be thermally grown on silicon.

The procedure for forming glass passivation films is also a high temperature process, because of the required particle fusing step. The high temperature can adversely affect the metal contacts to the elements of the semiconductor device and the dopants within the semiconductor body as discussed above. The type of glass that can be used is limited to low melting point glasses because of the fusing step. Unfortunately it is the higher melting point glasses which are most desirable for passivation of devices.

Sputtering of insulator films has been proposed as a method for forming insulator films on semiconductor surfaces for masking and passivation purposes. The process seemed attractive because insulator coatings can be deposited on any semiconductor body irrespective of semiconductor composition. Also, the temperature of the semiconductor body can be kept low and the semiconductor body itself would not be affected. Further, the insulator film could be chosen to match the thermal expansion properties of the substrate and thereby permit thick insulator coatings without thermal stresses. In practice, however, the process has not been successful because the prior art processes have caused damage to the semiconductor surface which ruins the electrical characteristics of the semiconductor devices located in the semiconductod body.

It is thus an object of this invention to provide a method for sputtering a film over a semiconductor surface without materially damaging the surface.

It is another object of this invention to provide a method for efficiently depositing an insulator film of any composition upon the bare surface of a semiconductor body without limitation to the semiconductor composition.

It is still another object of this invention to provide a method for sputtering an insulator film upon a bare semiconductor surface which includes at least one PN junction without adversely affecting the electrical characteristics of the PN junction.

It is a further object of this invention to provide a semiconductor structure which includes a semiconductor body having a substantially undamaged surface upon which an insulator film has been deposited by sputtering.

These and other objects are accomplished in accordance with the broad aspects of the present invention by providing a sputtering process which is so controlled as to apply an insulator film to the semiconductor surface without adversely affecting the surface. The initial phase of the sputtering deposition of the insulator film onto the semiconductor surface is made at a power density of less than about 4 watts per square inch of cathode area of the sputting apparatus. This low power is preferably maintained until between about 500–1500 Angstrom units of the sputtered film are applied to the semiconductor surface. The power density is then increased to the customary power which is between about 20 to 40 watts per square inch of cathode area so as to increase the deposition rate of the sputtered film. The upper limit of power density is fixed by the power supply and the cathode cooling efficiency. The initial insulator film which was deposited at low power density acts as a protective coating for the film being deposited at the higher power density. Alternately, the power density can be increased slowly with time as the sputtered film builds up on the surface of the semiconductor material.

The foregoing and other objects, features and advantages of the invention will be apparent from the following more particular description of the preferred embodiments of the invention as illustrated in the accompanying drawings.

Figures 1, 2, 3:
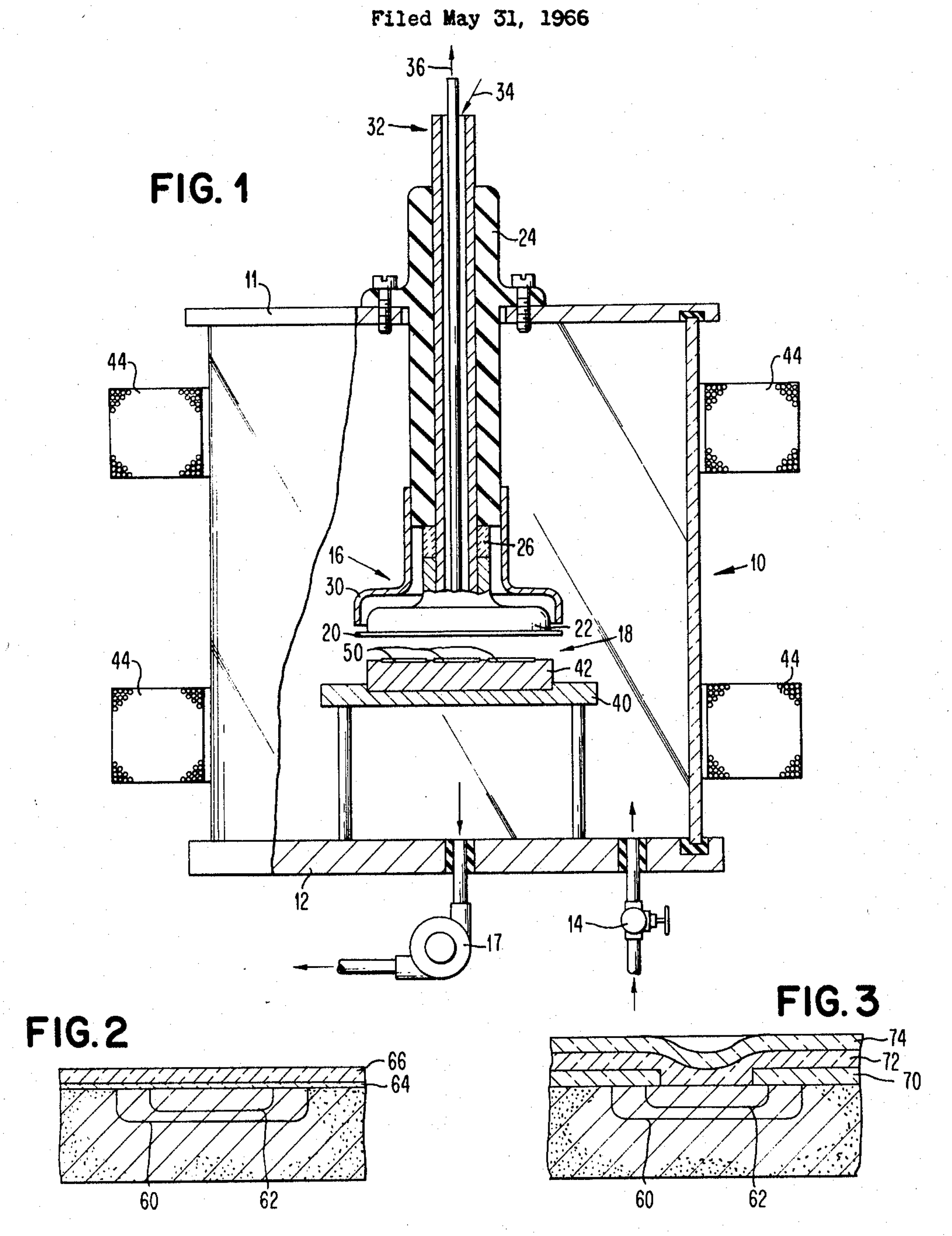
FIGURE 1 is a schematic drawing of one preferred sputtering system useful in practicing the method of the present invention.
FIGURE 2 is a cross-sectional illustration of a semiconductor structure having a deposited insulator layer which was formed according to the method of the present invention.
FIGURE 3 is another cross-sectional illustration of a semiconductor structure having a deposited insulator layer made according to the method of the present invention.

Referring now more particularly to FIGURE 1, there is shown one form of sputtering apparatus which can be used to perform the method of the present invention. This apparatus is described in detail in the patent application Ser. No. 428,733, filed Jan. 28, 1965, of P. D. Davidse and L. I. Maissel, and assigned to the same assignee as the present invention. Briefly, this sputtering apparatus includes a chamber 10 having a top plate 11 which is removably mounted on a base plate 12. A suitable gas, such as argon, supplied by a source 14 is maintained at a desired pressure in the chamber by means of a vacuum pump 17. Within the gas-filled enclosure are positioned an electrode structure 16 and a substrate support structure 18.

The electrode assembly 16 includes a target 20 which is composed of the material to be sputtered. Mounted on or positioned adjacent to the target 20 is a metal electrode 22 which is designated the cathode for reference. This electrode 22 is insulated from the supporting column 24 by means of ceramic seal 26. The supporting column 24 is attached to the top plate 11 of the sputtering structure 10. A grounded shield 30 is supported on the post 24. The metal shield 30 partially encloses the electrode 22 and protects the electrode from unwanted sputtering. A cooling structure 32 having inlet and outlet ports 34 and 36, respectively, is centrally located within the post 24. The cooling structure 32 can be used to cool the electrode structure 16, if necessary, by circulating water or other fluid through the cooling structure 32. The copper cooling structure 32 is connected as the electrical conductor through the post 24 to connect the electrode with the RF power source (not shown).

The substrate support structure 18 includes a support means 40 which is mounted on the base plate 12 of the sputtering apparatus 10. A substrate holder 42 is positioned and held on the upper surface of the support means 40 by any convenient means. The semiconductor wafers 50 are positioned on the substrate holder by any conventional means. Either cooling coils or heating means can be positioned within or adjacent to the substrate holder 42 for cooling or heating the wafers. The support structure 18 is connected as the other electrode of the sputtering apparatus. This electrode is designated as the anode. Electromagnets 44 are preferably used to concentrate the glow discharge by the magnet's magnetic field.

It has been discovered that unprotected semiconductor surfaces can be coated by the sputtering method without damaging or otherwise affecting, in any substantial way, the electrical characteristics of semiconductor devices in the surface. This sputtering deposition is accomplished by maintaining the power density applied to the cathode of the sputtering apparatus at a value less than about 4 watts per square inch of cathode area. It is theorized that this low power sputtering technique does not damage the electrical characteristics of the semiconductor surface because the particles sputtered out of the cathode reach the substrate with energies low enough not to damage the semiconductor surface. When power is applied greater than this value, damage is caused to the semiconductor surface in the form of radiation damage because of the relatively high kinetic energy of arrival of the sputtered species.

A disadvantage of the slow sputtering procedure of this invention is the length of time required to apply the desired coating thickness. This disadvantage is reduced by raising the power applied to between about 20 to 40 watts per square inch after between about 500 to 1500 Angstrom units have been formed on the semiconductor surface. The increased power allows the more rapid formation of the insulated film on the semiconductor surface, while the thin insulator layer protects the semiconductor surface from adverse effects of the sputtered particles striking the surface. Alternately, the power supply can be programmed in such a way that the power applied across the anode and cathode electrodes of the apparatus is gradually increased as the insulator film builds up. It is, however, preferred that about 200 Angstrom units are deposited at the low power density before any increase in power is made above about 4 watts per square inch. In this alternative the greatest amount of film can be built up in the shortest time without the danger of adverse effects on the electrical characteristics of the silicon surface during insulator film buildup. The upper thickness limit of the sputtered film is dependent upon the required thickness and the thermal stress caused by the coating. In practice more than 30,000 Angstrom units of silicon dioxide have been sputtered on silicon surfaces.

FIGURES 2 and 3 schematically show semiconductor structures which have been passivated according to the method of the present invention. FIGURE 2 shows a semiconductor transistor device having PN junctions 60 and 62 which are protected by a passivation film which includes layers 64 and 66 that have been built up over the semiconductor surface which includes PN junctions. The first film 64 was applied using a low power, slow sputtering procedure as described above and the insulator film 66 was applied during the higher power application across the anode and cathode of the chamber as described above. FIGURE 3 shows a similar structure having PN junctions 60 and 62. However, a resulting thermally grown silicon dioxide film 70 covers most of the surface of the device, since the conventional thermal oxide masking procedures were used in the fabrication of this silicon device. The passivation film which includes layers 72 and 74 may be in the form of a glass or other suitable insulating material. The passivation film 72 and 74 covers the thermally grown layer 70 in addition to the hole 76 in the thermally grown silicon dioxide coating which was used to form the emitter-base junction 62 in the semiconductor body. Again, the layer 72 was formed using the slow sputtering technique of this invention and the layer 74 was used in the fast sputtering technique.

The total thicknesses of the films 64, 66 and 72, 74 are different depending upon the use of the films. Where the film is to act as a diffusion mask, the thickness is preferably between about 500 and 6,000 Angstrom units depending upon the diffusant used, the diffusion time and the insulator film used. For example, the denser silicon nitride film can be thinner than a silicon dioxide film for the same masking capability. Where the film is for device passivation, thicker films of up to about 30,000 Angstrom units are used to be sure that contaminants do not reach the devices during their useful lifetimes.

After the application of a sputtered layer, the surface of the coated semiconductor device can be altered by an annealing procedure. It has been found, for example, that the combination of the initial slow sputtering and final fast sputtering method described above on a silicon surface produces an almost neutral surface. When the surface was annealed at a temperature of about 300 to 500° C. for 15 minutes to 4 hours in air or nitrogen a further reduction in surface charge was obtained.

The procedure of the present invention is applicable to insulators of all types such as fused quartz or silicon dioxide, glasses, silicon nitride, etc. because the sputtering process cannot distinguish between chemical compositions. The sputtering can be done in an inert atmosphere or a reactive atmosphere. Glasses and silicon nitride are examples of insulators which can be applied best when using a reactive atmosphere. Silicon nitride films have been deposited successfully at low power densities by reactive sputtering onto silicon semiconductor surfaces. Also the particular semiconductor surface being coated does not limit the process of the present invention because the particle energies required to damage various semiconductor surfaces do not vary greatly from one material to another.

The following are examples of the present invention in detail. The examples are included merely to aid in the understanding of the invention, and variations may be made by one skilled in the art without departing from the spirit and scope of this invention.

EXAMPLES 1 THROUGH 7

Figure 4:
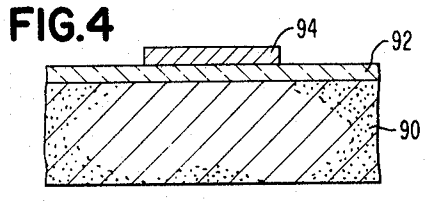
FIGURE 4 illustrates a test device which was used to evaluate the process of the present invention.

Standard metal-oxide-silicon (MOS) devices, such as shown in FIGURE 4, were made for each of the examples. The silicon substrate 90 used in all cases was composed of 6 ohm-cm. P-type silicon. In each example, a layer of silicon dioxide 92 was sputtered upon the bare surface of the silicon substrate 90. The thickness of the silicon dioxide layer 92 was 1 micron or 10,000 Angstrom units. An electrode 94 composed of aluminum was was deposited by evaporation on the silicon dioxide layer. In Examples 2, 5 and 7, prior to the sputtering of the silicon dioxide layer a film of 2800 Angstrom units of thermally grown silicon dioxide was formed on the silicon surface of silicon substrate 90 by heating the silicon substrate in oxygen at 1050° C. The MOS device in each example was annealed in nitrogen at 300° C. for 60 minutes to further reduce the surface charge density. The table below indicates the surface used, the sputtering rate and substrate temperature conditions of each example together with the resulting surface characteristic in the form of surface charge density before and after annealing for each example. The term fast under sputtering rate indicates a power applied of 36 watts per square inch and the term slow indicates a power applied of 2 watts per square inch. A 1500 Angstrom units layer of silicon dioxide was applied during each slow sputtering period and 8500 Angstrom units was applied during the fast sputtering periods.

| Ex. | Surface | Sputtering rate | Substrate temp. (° C.) | Surface charge density (in $10^{11}$ charges per cm.$^2$) | |
|---|---|---|---|---|---|
| | | | | Virgin devices | After annealing |
| 1 | Bare | Fast | 50 | >−81 | −18 |
| 2 | 2,800 A | do | 50 | −16 | −5.8 |
| 3 | Bare | Slow-fast | 50 | +1.2 | −1.2 |
| 4 | do | Fast | 500 | −70 | −45 |
| 5 | 2,800 A | do | 500 | −12 | −10 |
| 6 | Bare | Slow-fast | 500 | −16 | −6.6 |
| 7 | 2,800 A | No sputtering | | −5 | −5 |

The MOS trapped charge values for each of the examples were obtained by measuring the capacitance of the resulting MOS structure as a function of applied voltage between the metal field plate 94 and the silicon substrate 90. The experimental C–V curve was compared with the theoretical curve corresponding to the conditions of fabrication, that is, silicon dioxide thickness, bulk impurity concentration, and so forth. The horizontal displacement between the two curves was used to determine the surface-charge density and hence the surface potential.

The acceptable surface charge density level for most critical semiconductor devices is about $20 \times 10^{11}$ charges per square centimeter. As can be seen from this table the films deposited onto wafers having a thermal oxide layer, Examples 2 and 5, or onto bare wafers with the method of the present invention, Examples 3 and 6, showed surface charge levels less than the acceptable surface charge density. Films deposited onto bare wafers at high deposition rates, Examples 1 and 4, showed high charge levels even after annealing. For comparison, the charge level at the interface of the thermally grown oxide and the silicon is given as Example 7 in the table. It is seen from Example 7 that some surface charge is present even without a sputtering deposition on the semiconductor surface.

The invention thus provides the first satisfactory procedure for depositing sputtered films in general, and insulator films in particular to a semiconductor surface without harming the electrical or physical characteristics of the semiconductor surface. The method allows the use of standard sputtering equipment with the limitation of close control of the operation of the equipment. Although the use of the method of this invention for passivation films has been extensively discussed, it is understood that there are many other uses of the method particularly for masking semiconductor surfaces during the fabrication of semiconductor devices.

While the invention has been particularly shown and described with reference to preferred embodiments thereof, it will be understood by those skilled in the art that the foregoing and other changes in form and details may be made therein without departing from the spirit and scope of the invention.

What is claimed is:

1. The method for sputtering a film over a bare semiconductor surface comprising:

providing an atmosphere capable of supporting a glow discharge between anode and cathode electrodes within a chamber; and applying power density less than about 4 watts per square inch across said anode and cathode to produce a sputtered film of between about 500 and 1500 Angstrom units over said semiconductor surface within said chamber whereby said surface remains substantially free from damage.

2. The method of claim 1 further comprising: increasing the said power density between about 20 and 40 watts per square inch, after said between about 500 and 1500 Angstrom units have been sputtered over said semiconductor surface, to sputter additional film on said semiconductor surface.

3. The method of claim 2 wherein the said semiconductor surface is silicon, silicon dioxide is the sputtered film and the resulting silicon surface is approximately neutral.

4. The method of claim 3 further comprising annealing said resulting silicon surface at a temperature between about 300 and 500° C. for less than about 4 hours to reduce the surface charge density of said semiconductor surface.

5. The method of claim 1 further comprising increasing the power slowly with time as the sputtered film builds up.

6. The method of claim 1 wherein a portion of the said semiconductor surface being sputtered onto includes at least one PN junction.

7. The method of claim 1 wherein said applied power is RF power.

8. The method of claim 1 wherein said atmosphere is reactive and a silicon nitride film is formed over said semiconductor surface.

9. The method of claim 1 wherein said atmosphere is reactive and a glass film is formed over said semiconductor surface.

10. The method for sputtering an insulator film upon a bare silicon semiconductor surface which includes at least one PN junction comprising:

providing an atmosphere capable of supporting a glow discharge between anode and cathode electrodes within a chamber;

applying RF power density less than about 4 watts per square inch across said anode and cathode to produce a sputtered insulator film of between about 500 and 1500 Angstrom units over said silicon surface within said chamber; and increasing the said power density between about 20 and 40 watts per square inch after said about 500 and 1500 Angstrom units have been sputtered over said silicon surface, to sputter additional film on said silicon surface.

11. The method of claim 10 further comprising gradually increasing the said power density from less than about 4 watts per square inch at the beginning of sputtering up to between about 20 and 40 watts per square inch after more than about 500 and 1500 Angstrom units of film has been applied to said silicon surface.

12. The method of claim 10 wherein said sputtered insulator film is silicon dioxide and the resulting silicon surface is almost neutral.

13. The method of claim 10 wherein said atmosphere is reactive and a glass film is formed over said semiconductor surface.

14. The semiconductor structure comprising:

a semiconductor body, an insulator film of between about 500 to 1500 Angstrom units over a surface of said body; and said film being produced by sputtering in a suitable chamber while applying a power density of less than about 4 watts per square inch across the anode and cathode of said chamber.

15. The semiconductor structure of claim 14 further comprising a second insulator film to form a total insulator film thickness of between about 500 and 6000 Angstrom units; and said second film being produced by sputtering in a suitable chamber while applying power between about 20 and 40 watts per square inch across the anode and cathode of said chamber.

16. The semiconductor structure of claim 14 further comprising a second insulator film to form a total insulator film thickness of no more than 30,000 Angstrom units; and said second film being produced by sputtering in a suitable chamber while applying power between about 20 and 40 watts per square inch across the anode and cathode of said chamber.

17. The semiconductor surface of claim 14 wherein said surface of said semiconductor body contains at least one operative PN junction and the body is substantially silicon.

18. The semiconductor surface of claim 14 wherein said surface of said semiconductor body contains at least one operative PN junction and the body is substantially germanium.

19. The semiconductor surface of claim 14 wherein said surface of said semiconductor body contains at least one operative PN junction and the body is substantially a III–V semiconductor compound.

References Cited

UNITED STATES PATENTS 3,287,243 11/1966 Ligenza ------------ 204—192

OTHER REFERENCES

Bjorck: "Surface Passivation of Semiconductor Devices by Means of Reactively Sputtered Coatings," Le Vide, No. 105, May–June 1963.

JOHN H. MACK, *Primary Examiner.*

S. S. KANTER, *Assistant Examiner.*

U.S. Cl. X.R.

338—308